(12) United States Patent
Chen et al.

(10) Patent No.: US 10,517,196 B2
(45) Date of Patent: Dec. 24, 2019

(54) FLEXIBLE DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventors: Bao Chen, Hubei (CN); Shuru Lin, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/577,778

(22) PCT Filed: Nov. 24, 2017

(86) PCT No.: PCT/CN2017/112874
§ 371 (c)(1),
(2) Date: Nov. 29, 2017

(87) PCT Pub. No.: WO2019/047383
PCT Pub. Date: Mar. 14, 2019

(65) Prior Publication Data
US 2019/0075688 A1 Mar. 7, 2019

(30) Foreign Application Priority Data
Sep. 5, 2017 (CN) .......................... 2017 1 0788429

(51) Int. Cl.
*H01L 51/52* (2006.01)
*H01L 27/32* (2006.01)
*H05K 7/20* (2006.01)
*H01L 51/00* (2006.01)

(52) U.S. Cl.
CPC ..... *H05K 7/20954* (2013.01); *H01L 51/0097* (2013.01); *H01L 51/529* (2013.01); *H01L 27/323* (2013.01); *H01L 51/5281* (2013.01); *H01L 2251/5338* (2013.01)

(58) Field of Classification Search
CPC ......... H01L 33/60; H01L 33/20; H01L 33/62; H01L 33/58; H05K 1/028
USPC ............. 257/98, 72, 59; 438/22, 25, 48, 128
See application file for complete search history.

(56) References Cited

U.S. PATENT DOCUMENTS

| | | | |
|---|---|---|---|
| 7,427,140 B1* | 9/2008 | Ma ........................ | G06F 1/1616 359/604 |
| 2016/0212890 A1* | 7/2016 | Jeong et al. ....... | H05K 7/20963 |
| 2017/0038798 A1* | 2/2017 | Lee ........................ | G06F 1/1616 |
| 2017/0207286 A1 | 7/2017 | Yao | |

(Continued)

FOREIGN PATENT DOCUMENTS

| CN | 104485351 A | 4/2015 |
|---|---|---|
| CN | 104821138 A | 8/2015 |
| CN | 105975135 A | 9/2016 |

*Primary Examiner* — Thinh T Nguyen
(74) *Attorney, Agent, or Firm* — Mark M. Friedman

(57) ABSTRACT

A flexible display device includes a flexible display panel and a heat dissipating layer. The flexible display panel includes a bending region and a non-bending region. The heat dissipating layer includes a first heat dissipating sublayer and a second heat dissipating sublayer. The first heat dissipating sublayer is disposed on the non-bending region and the second heat dissipating sublayer is disposed on the first heat dissipating sublayer.

13 Claims, 3 Drawing Sheets

(56) References Cited

U.S. PATENT DOCUMENTS

| | | |
|---|---|---|
| 2017/0307929 A1* | 10/2017 | Nakazawa et al. ..... G02F 1/167 |
| 2018/0067522 A1* | 3/2018 | Namkung et al. ..... H05K 1/028 |
| 2018/0068594 A1 | 3/2018 | Dong |
| 2018/0166507 A1* | 6/2018 | Hwang et al. ........ H01L 27/323 |

* cited by examiner

FLEXIBLE DISPLAY DEVICE

CROSS REFERENCE TO RELATED APPLICATION

This application claims the priority of International Application No. PCT/CN2017/112874, filed on 24 Nov. 2017, which claims priority to Chinese Application No. 20170788429.5 filed on 5 Sep. 2017. The entire disclosures of each of the applications are incorporated herein by reference.

BACKGROUND

1. Field of the Disclosure

The present disclosure relates to display technology, and more particularly, to a flexible display device.

2. Description of the Related Art

Organic light-emitting diodes (OLEDs) provide benefits like self-illumination, low power consumption, and fast response time, and thus are widely used in display technologies. Flexible OLEDs (FOLEDs), having a substrate made of a flexible material, have a certain ability to bear deformation. They can be rolled and folded, and thus are widely used in display screens of cell phones and televisions.

Batteries and integrated circuit (IC) chips inside the cell phones and televisions generate a large amount of heat, which will affect how FOLEDs work. In production of OLEDs, organic films manufactured by thermal evaporation belong to amorphous forms. Some of the organic materials used to manufacture the organic films have low glass transition temperatures, and thus are easily affected by the ambient temperature to transform into crystalline forms. Changes of physical properties of the organic materials will cause the brightness of OLEDs to degrade. Some FOLEDs adopt a heat dissipating layer to help dissipating the heat. However, this approach will cause a decrease in bending durability of the FOLEDs.

SUMMARY

The objective of the present disclosure is to provide a flexible display device capable of improving not only the heat dissipation performance of the flexible display device but also the bending durability of the flexible display device.

The embodiments of the present disclosure provide a flexible display device, including a flexible display panel and a heat dissipating layer; the flexible display panel including a bending region and a non-bending region; the heat dissipating layer including a first heat dissipating sublayer and a second heat dissipating sublayer, the first heat dissipating sublayer disposed on the non-bending region and the second heat dissipating sublayer disposed on the first heat dissipating sublayer; wherein the bending region is rectangular, and the length of one edge of the bending region is $\pi r$, where r is a radius of maximum curvature of the flexible display panel; wherein the flexible display device further includes a buffer layer disposed between the first heat dissipating sublayer and the flexible display panel.

In some embodiments, the flexible display panel includes one bending region and two non-bending regions; the bending region is symmetric with respect to a central plane of the flexible display panel; and the two non-bending regions are disposed at two sides of the bending region, respectively.

In some embodiments, the bending region is disposed in a peripheral zone of the flexible display panel; and the non-bending region is disposed in a middle zone of the flexible display panel and the non-bending region and the bending region are adjacent to each other.

In some embodiments, the material of the first heat dissipating sublayer is graphite or nanocarbon and thickness of the first heat dissipating sublayer is 12-18 mm.

In some embodiments, the material of the second heat dissipating sublayer is copper and thickness of the second heat dissipating sublayer is 10-50 mm.

In some embodiments, the flexible display device further includes a buffer layer disposed between the buffer layer and the first heat dissipating sublayer.

In some embodiments, the material of the metal layer is nickel-based amorphous alloy or zirconium-based amorphous alloy.

In some embodiments, the flexible display device further includes a thermal conductive glue layer disposed between the metal layer and the first heat dissipating sublayer.

In some embodiments, the flexible display panel includes a flexible backplate, a display layer, a polarizer, a touch screen, and a cover window that overlap one another; and the heat dissipating layer is disposed at one side of the flexible backplate away from the display layer.

The embodiments of the present disclosure provide a flexible display device, including a flexible display panel and a heat dissipating layer; the flexible display panel including a bending region and a non-bending region; the heat dissipating layer including a first heat dissipating sublayer and a second heat dissipating sublayer, the first heat dissipating sublayer disposed on the non-bending region and the second heat dissipating sublayer disposed on the first heat dissipating sublayer.

In some embodiments, the flexible display panel includes one bending region and two non-bending regions; the bending region is symmetric with respect to a central plane of the flexible display panel; and the two non-bending regions are disposed at two sides of the bending region, respectively.

In some embodiments, the bending region is disposed in a peripheral zone of the flexible display panel; and the non-bending region is disposed in a middle zone of the flexible display panel and the non-bending region and the bending region are adjacent to each other.

In some embodiments, the material of the first heat dissipating sublayer is graphite or nanocarbon and thickness of the first heat dissipating sublayer is 12-18 mm.

In some embodiments, the material of the second heat dissipating sublayer is copper and thickness of the second heat dissipating sublayer is 10-50 mm.

In some embodiments, the bending region is rectangular, and the length of one edge of the bending region is $\pi r$, where r is a radius of maximum curvature of the flexible display panel.

In some embodiments, the flexible display device further includes a buffer layer disposed between the first heat dissipating sublayer and the flexible display panel.

In some embodiments, the flexible display device further includes a metal layer disposed between the buffer layer and the first heat dissipating sublayer.

In some embodiments, the material of the metal layer is nickel-based amorphous alloy or zirconium-based amorphous alloy.

In some embodiments, the flexible display device further includes a thermal conductive glue layer disposed between the metal layer and the first heat dissipating sublayer.

In some embodiments, the flexible display panel includes a flexible backplate, a display layer, a polarizer, a touch screen, and a cover window that overlap one another; and the heat dissipating layer is disposed at one side of the flexible backplate away from the display layer.

In the flexible display device of the embodiments of the present disclosure, the heat dissipating layer is disposed corresponding to the non-bending region of the flexible display panel. Not only the heat dissipation performance of the flexible display device, but also the bending durability of the flexible display device are improved.

To make above content of the present disclosure more easily understood, it will be described in detail by using preferred embodiments in conjunction with the appending drawings.

DETAILED DESCRIPTION OF THE PREFERRED EMBODIMENTS

The following descriptions for the respective embodiments are specific embodiments capable of being implemented for illustrating the present disclosure with reference to the appended figures. In describing the present disclosure, spatially relative terms such as "upper", "lower", "front", "back", "left", "right", "inner", "outer", "lateral", and the like, may be used herein for ease of description as illustrated in the figures. Therefore, the spatially relative terms used herein are intended to illustrate the present disclosure for ease of understanding, but are not intended to limit the present disclosure.

In the appending drawings, units with similar structures are indicated by the same reference numbers.

References herein to "embodiment" means that a particular feature, structure, or characteristic described in connection with the embodiment can be included in at least one example embodiment of the present disclosure. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

Figure 1:
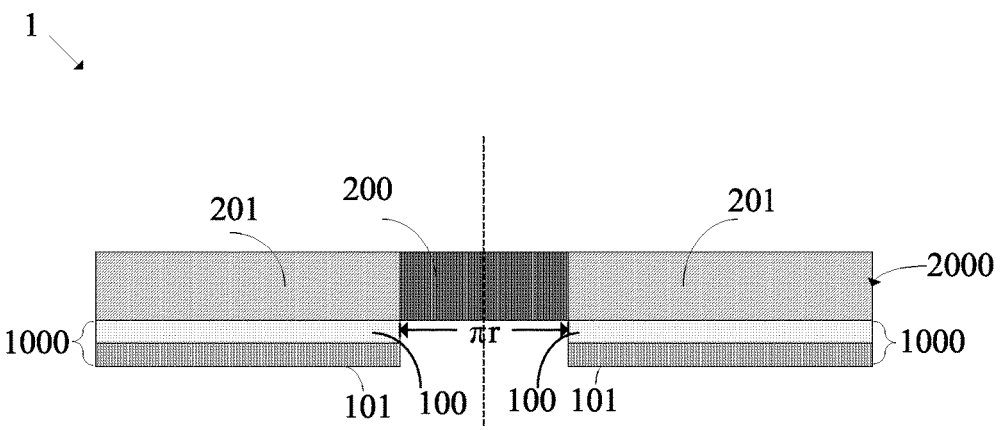
FIG. 1 is a schematic diagram showing a first structural type of a flexible display device provided in accordance with an embodiment of the present disclosure.

FIG. 1 is a schematic structural diagram showing a flexible display device provided in accordance with an embodiment of the present disclosure. The flexible display device 1 includes a flexible display panel 2000 and a heat dissipating layer 1000. The flexible display panel includes a flexible backplate, a display layer, a polarizer, a touch screen, and a cover window that overlap one another. The cover window is configured to be light transmittable. The touch screen is configured to be light transmittable and to detect touch operations on a surface of the touch screen. The polarizer can turn natural light into polarized light such that the light polarized with respect to a particular direction can transmit and the light polarized with respect to other directions will be absorbed. The display screen is configured to display images. The flexible backplate is configured to support the display layer, the polarizer, the touch screen, and the cover window.

The flexible display panel 2000 is divided into a bending region 200 and a non-bending region 201 according to a bending property of the flexible display panel 2000. The bending region 200 has a large capacity for stress. The non-bending region 201 has a small capacity for stress and accordingly, bending operations are not performed on the non-bending region 201. When the flexible display panel 2000 bends or folds, the heat dissipating layer 1000 bears a drastic stress and may be thus deformed or even damaged. Accordingly, in the present embodiment, the heat dissipating layer 1000 is disposed on the non-bending region 201, that is, on a part of the flexible display panel 2000 that bending operations are not cast onto. Accordingly, the heat dissipating layer 1000 avoids the stress caused by bending the flexible display panel 2000. Not only heat dissipation performance but also bending durability of the flexible display device 1 are improved.

In some embodiments, as shown in FIG. 1, the flexible display panel 2000 includes one bending region 200 and two non-bending regions 201. The bending region 200 is symmetric with respect to a central plane of the flexible display panel 2000. The two non-bending regions are disposed at two sides of the bending region 200, respectively. In some embodiments, the bending region 200 is disposed in a peripheral zone of the flexible display panel 2000 and the non-bending region 201 is disposed in a middle zone of the flexible display panel 2000. The bending region 200 and the non-bending region 201 are adjacent to each other. Above all, in the embodiments of the present disclosure, the positions of the bending region 200 and the non-bending region 201 on the flexible display panel 2000 can be set according to practical needs, and are not limited herein.

In some embodiments, manufacturing the heat dissipating layer 1000 can be achieved by forming the heat dissipating layer 1000 directly on the flexible display panel 2000 and then removing the heat dissipating layer 1000 on the bending region 200. In some embodiments, portions on the flexible display panel 2000 that can be bent and cannot be bent may be classified first, that is, classified into the bending region 200 and the non-bending region 201. Then, the heat dissipating layer 1000 is manufactured on the non-bending region 201. This can reduce the waste of material of the heat dissipating layer 1000. As shown in FIGS. 1 to 4, the bending region 201 can be rectangular, and the length of one edge of the bending region 201 is πr, where r is a radius of maximum curvature of the flexible display panel 2000.

The heat dissipating layer 1000 is made of a high thermal conductive material such as cooper, graphene, and nanocarbon. It is noted that the heat dissipating layer 1000 can be formed using mixed materials consisting of a lot of types of high thermal conductive materials, and can also be formed by sequentially overlapping a plurality of heat dissipating sublayers made of different materials. Formation of the heat dissipating layer 1000 is not particularly limited herein.

The heat dissipating layer 1000 includes a first heat dissipating sublayer 100 and a second heat dissipating sublayer 101. The first heat dissipating sublayer 100 is disposed on the non-bending region and the second heat dissipating sublayer 101 is disposed on the first heat dissipating sublayer 100. Both of the first heat dissipating sublayer 100 and the second heat dissipating sublayer 101 are used for heat dissipation.

In some embodiments, the material of the first heat dissipating sublayer 100 is graphite. Graphite of natural or synthetic origin can be used. In some embodiments, nanocarbon is simple in manufacture and low in cost, and thus can be taken as a material of the first heat dissipating sublayer 100. The thickness of the first heat dissipating sublayer 100 is 12-18 mm. Preferably, the thickness of the first heat dissipating sublayer 100 is set to 15 mm.

In some embodiments, the material of the second heat dissipating sublayer 101 is copper and the thickness of the second heat dissipating sublayer 100 is 10-50 mm.

Figure 2:
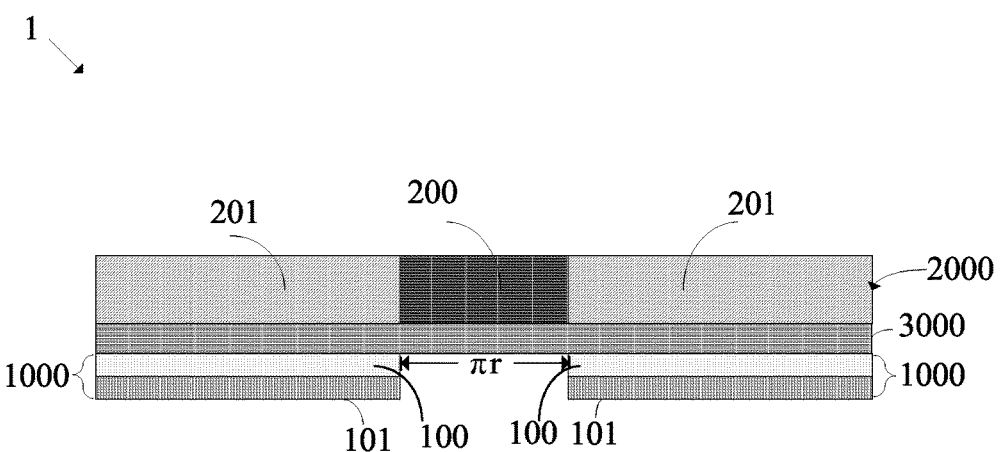
FIG. 2 is a schematic diagram showing a second structural type of a flexible display device provided in accordance with an embodiment of the present disclosure.

In some embodiments, as shown in FIG. 2, the flexible display device 1 further includes a buffer layer 3000. The buffer layer 3000 is disposed between the first heat dissipating sublayer 100 and the flexible display panel 2000. The buffer layer 3000 can help the flexible display panel 2000 to resist the bending stress.

Figure 3:
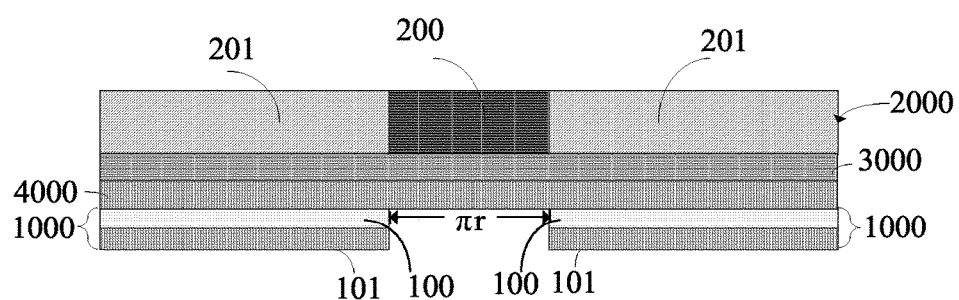
FIG. 3 is a schematic diagram showing a third structural type of a flexible display device provided in accordance with an embodiment of the present disclosure.

In some embodiments, as shown in FIG. 3, the flexible display device 1 further includes a metal layer 4000. The metal layer 4000 is disposed between the buffer layer 3000 and the first heat dissipating sublayer 100. The metal layer 4000 is made of a tough and stiff material such as nickel-based amorphous alloy and zirconium-based amorphous alloy. The metal layer 4000 can help the flexible display device 1 to change its state. For example, when the flexible display device 1 is changed from a bending state to a straight state, the metal layer 4000 can help the flexible display device 1 to get back to the straight state quickly.

Figure 4:
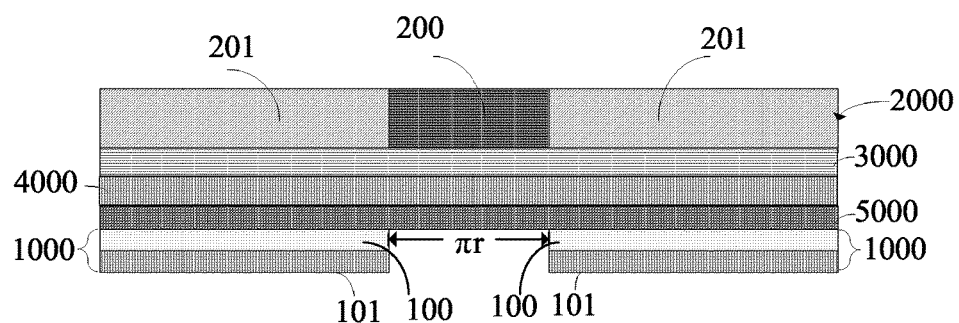
FIG. 4 is a schematic diagram showing a fourth structural type of a flexible display device provided in accordance with an embodiment of the present disclosure.

In some embodiments, as shown in FIG. 4, the flexible display device 1 further includes a thermal conductive glue 5000. The thermal conductive glue 5000 is disposed between the metal layer 4000 and the first heat dissipating sublayer 100, and is used to adhere the first heat dissipating sublayer 100 to the metal layer 400. Specifically, the second heat dissipating sublayer 101 can be first formed by manufacturing a thicker copper layer, and the first heat dissipating sublayer 100 is then formed by manufacturing a graphene film on the copper layer. Finally, the first heat dissipating sublayer 100 adheres to the metal layer 4000 via the thermal conductive glue.

Figure 5:
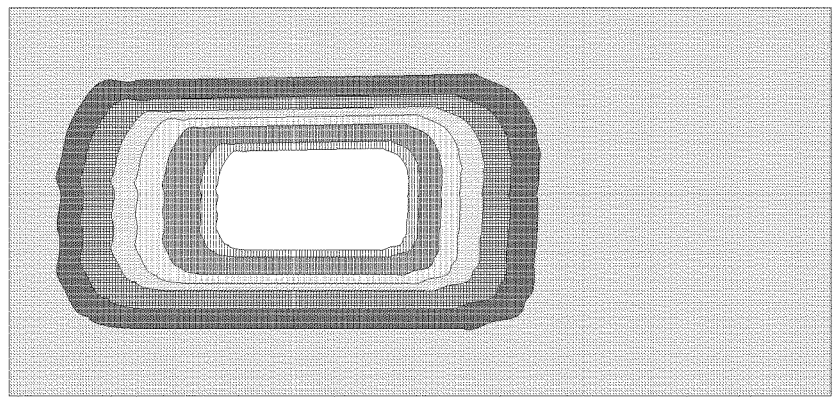
FIG. 5 is a schematic diagram showing a temperature distribution of an existing flexible display device.
Figure 6:
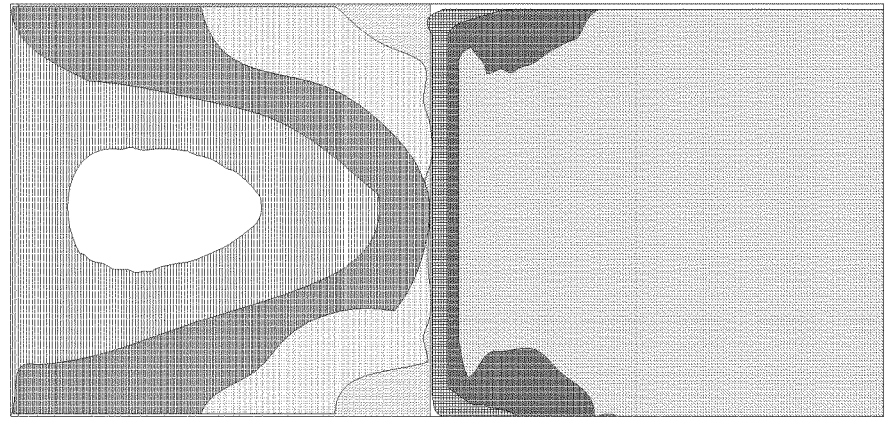
FIG. 6 is a schematic diagram showing a temperature distribution of a flexible display device provided in accordance with an embodiment of the present disclosure.

In the embodiments of the present disclosure, thermodynamic parameters of related materials are shown in Table 1-1 below. In a case that the flexible display device 1 only includes the flexible display panel 2000, its highest temperature reaches about 78° C. after absorbing the heat from external sources such as a battery, as shown in FIG. 5. When the heat dissipating layer 1000, the buffer layer 3000, the metal layer 4000, and the thermal conductive glue layer 5000 are added as illustrated in the present embodiment, its highest temperature becomes 42.402° C., as shown in FIG. 6. It can be known that heat dissipating ability of the flexible display device 1 of the embodiments of the present disclosure is greatly improved.

TABLE 1-1

|  | Metal layer | Thermal conductive glue | Copper | Graphite | Buffer layer |
|---|---|---|---|---|---|
| Coefficient of thermal | 5 | 0.6 | 401 | Planar: 1500 Vertical: 5 | 0.038 |

TABLE 1-1-continued

|  | Metal layer | Thermal conductive glue | Copper | Graphite | Buffer layer |
|---|---|---|---|---|---|
| conductivity (W/m · K) |  |  |  |  |  |
| Free convection coefficient (W/m$^2$ · ° C.) |  |  | 12.5 |  |  |

In the flexible display device of the embodiments of the present disclosure, the heat dissipating layer is disposed corresponding to the non-bending region of the flexible display panel. Not only the heat dissipation performance of the flexible display device, but also the bending durability of the flexible display device are improved. Deployment of the buffer layer and the metal layer further increases the bending durability of the flexible display device.

Above all, while the preferred embodiments of the present disclosure have been illustrated and described in detail, various modifications and alterations can be made by persons skilled in this art. The embodiment of the present disclosure is therefore described in an illustrative but not a restrictive sense. It is intended that the present disclosure should not be limited to the particular forms as illustrated, and that all modifications and alterations which maintain the spirit and realm of the present disclosure are within the scope as defined in the appended claims.

What is claimed is:

1. A flexible display device, comprising:
    a flexible display panel comprising a bending region and a non-bending region;
    a heat dissipating layer comprising a first heat dissipating sublayer and a second heat dissipating sublayer, the first heat dissipating sublayer disposed on the non-bending region and the second heat dissipating sublayer disposed on the first heat dissipating sublayer;
    a buffer layer disposed between the first heat dissipating sublayer and the flexible display panel;
    a metal layer disposed between the buffer layer and the first heat dissipating sublayer; and
    a thermal conductive glue layer disposed between the metal layer and the first heat dissipating sublayer,
    wherein the first heat dissipating sublayer and the second heat dissipating sublayer are disposed corresponding to the non-bending region and not corresponding to the bending region, and the buffer layer, the metal layer, and the thermal conductive glue layer are disposed corresponding to the bending region and the non-bending region;
    wherein the material of the first heat dissipating sublayer is graphite or nanocarbon and the material of the second heat dissipating sublayer is copper;
    wherein the bending region is rectangular, and the length of one edge of the bending region is πr, where r is a radius of maximum curvature of the flexible display panel.

2. The flexible display device according to claim 1, wherein the flexible display panel comprises one bending region and two non-bending regions; wherein the bending region is symmetric with respect to a central plane of the flexible display panel; and wherein the two non-bending regions are disposed at two sides of the bending region, respectively.

3. The flexible display device according to claim 1, wherein the bending region is disposed in a peripheral zone of the flexible display panel; and wherein the non-bending region is disposed in a middle zone of the flexible display panel and the non-bending region and the bending region are adjacent to each other.

4. The flexible display device according to claim 1, wherein thickness of the first heat dissipating sublayer is 12-18 mm.

5. The flexible display device according to claim 1, wherein thickness of the second heat dissipating sublayer is 10-50 mm.

6. The flexible display device according to claim 1, wherein the material of the metal layer is nickel-based amorphous alloy or zirconium-based amorphous alloy.

7. A flexible display device, comprising:
a flexible display panel comprising a bending region and a non-bending region;
a heat dissipating layer comprising a first heat dissipating sublayer and a second heat dissipating sublayer, the first heat dissipating sublayer disposed on the non-bending region and the second heat dissipating sublayer disposed on the first heat dissipating sublayer;
a buffer layer disposed between the first heat dissipating sublayer and the flexible display panel;
a metal layer disposed between the buffer layer and the first heat dissipating sublayer; and
a thermal conductive glue layer disposed between the metal layer and the first heat dissipating sublayer,
wherein the first heat dissipating sublayer and the second heat dissipating sublayer are disposed corresponding to the non-bending region and not corresponding to the bending region, and the buffer layer, the metal layer, and the thermal conductive glue layer are disposed corresponding to the bending region and the non-bending region.

8. The flexible display device according to claim 7, wherein the flexible display panel comprises one bending region and two non-bending regions; wherein the bending region is symmetric with respect to a central plane of the flexible display panel; and wherein the two non-bending regions are disposed at two sides of the bending region, respectively.

9. The flexible display device according to claim 7, wherein the bending region is disposed in a peripheral zone of the flexible display panel; and the non-bending region is disposed in a middle zone of the flexible display panel and the non-bending region and the bending region are adjacent to each other.

10. The flexible display device according to claim 7, wherein the material of the first heat dissipating sublayer is graphite or nanocarbon and thickness of the first heat dissipating sublayer is 12-18 mm.

11. The flexible display device according to claim 7, wherein the material of the second heat dissipating sublayer is copper and thickness of the second heat dissipating sublayer is 10-50 mm.

12. The flexible display device according to claim 7, wherein the bending region is rectangular, and the length of one edge of the bending region is $\pi r$, where r is a radius of maximum curvature of the flexible display panel.

13. The flexible display device according to claim 7, wherein the material of the metal layer is nickel-based amorphous alloy or zirconium-based amorphous alloy.

* * * * *